United States Patent
Chen et al.

(10) Patent No.: US 10,872,867 B2
(45) Date of Patent: *Dec. 22, 2020

(54) FAN-OUT ANTENNA PACKAGING STRUCTURE AND PREPARATION METHOD THEREOF

(71) Applicant: SJ Semiconductor(Jiangyin) Corporation, Jiangyin (CN)

(72) Inventors: Yenheng Chen, Jiangyin (CN); Chengchung Lin, Jiangyin (CN); Jangshen Lin, Jiangyin (CN); Chengtar Wu, Jiangyin (CN); Chihon Ho, Jiangyin (CN)

(73) Assignee: SJ Semiconductor (Jiangyin) Corporation, JiangYin (CN)

( * ) Notice: Subject to any disclaimer, the term of this patent is extended or adjusted under 35 U.S.C. 154(b) by 112 days.

This patent is subject to a terminal disclaimer.

(21) Appl. No.: 16/170,984

(22) Filed: Oct. 25, 2018

(65) Prior Publication Data
US 2019/0333879 A1 Oct. 31, 2019

(30) Foreign Application Priority Data

Oct. 25, 2017 (CN) .......................... 2017 1 10086445
Oct. 25, 2017 (CN) .................... 2017 2 13862439 U

(51) Int. Cl.
*H01Q 11/08* (2006.01)
*H01L 23/66* (2006.01)
(Continued)

(52) U.S. Cl.
CPC .............. *H01L 23/66* (2013.01); *H01L 21/56* (2013.01); *H01L 23/3114* (2013.01);
(Continued)

(58) Field of Classification Search
CPC . H01L 23/5226; H01L 23/3128; H01L 24/08; H01L 24/13; H01L 24/11;
(Continued)

(56) References Cited

U.S. PATENT DOCUMENTS

| | | | |
|---|---|---|---|
| 2013/0009320 A1* | 1/2013 | Yoo ..................... | H01L 23/5226 257/774 |
| 2016/0190028 A1* | 6/2016 | Shi ........................ | H01L 24/973 257/739 |
| 2017/0345731 A1* | 11/2017 | Chiang ................ | G06K 9/0002 |

FOREIGN PATENT DOCUMENTS

CN     105225965      *  1/2016

* cited by examiner

*Primary Examiner* — Awat M Salih
(74) *Attorney, Agent, or Firm* — Alston & Bird LLP

(57) ABSTRACT

The present disclosure provides a fan-out antenna packaging structure and a method for preparing the same. The fan-out antenna packaging structure comprises: a semiconductor chip; a plastic packaging material layer comprising a first surface and an opposite second surface, wherein the plastic packaging material layer packages a periphery of the semiconductor chip; a metal connecting pole located in the plastic packaging material layer and running through the plastic packaging material layer from top to bottom; an antenna structure located on the first surface of the plastic packaging material layer and electrically connected with the metal connecting pole; are distribution layer located on the second surface of the plastic packaging material layer and electrically connected with the semiconductor chip and the metal connecting pole; and a solder bump located on a surface, insulated from the plastic packaging material layer, of the redistribution layer, and electrically connected with the redistribution layer.

5 Claims, 6 Drawing Sheets

(51) Int. Cl.
  *H01L 23/522* (2006.01)
  *H01L 23/00* (2006.01)
  *H01Q 1/22* (2006.01)
  *H01L 21/56* (2006.01)
  *H01L 23/31* (2006.01)

(52) U.S. Cl.
  CPC .......... *H01L 23/5226* (2013.01); *H01L 24/08* (2013.01); *H01L 24/11* (2013.01); *H01L 24/13* (2013.01); *H01Q 1/2283* (2013.01); *H01L 2223/6677* (2013.01); *H01L 2224/0231* (2013.01); *H01L 2224/02379* (2013.01); *H01L 2224/0401* (2013.01)

(58) Field of Classification Search
  CPC ......... H01L 24/81; H01L 24/16; H01L 21/56; H01L 21/568; H01L 21/6835; H01L 23/3114; H01L 2224/0231; H01L 2224/0401; H01L 2224/02379; H01L 2224/13139; H01L 2224/13111; H01L 2224/13166; H01L 2224/13124; H01L 2224/13155; H01L 2224/13144; H01L 2224/81005; H01L 2224/16235; H01L 2223/6677; H01L 2223/6616; H01L 2924/15311; H01L 2924/1533; H01L 2221/68359; H01L 2221/68345; H01L 2221/68381; H01Q 1/2283; H01Q 9/27; H01Q 11/08; H01Q 11/083
  See application file for complete search history.

FAN-OUT ANTENNA PACKAGING STRUCTURE AND PREPARATION METHOD THEREOF

CROSS REFERENCES TO RELATED APPLICATIONS

This application claims the benefit of priority to Chinese Patent Application No. CN2017110086445, entitled "Fan-Out Antenna Packaging Structure and Preparation Method thereof", filed with SIPO on Oct. 25, 2017, and Chinese Patent Application No. CN2017213862439, entitled "Fan-Out Antenna Packaging Structure", filed with SIPO on Oct. 25, 2017, the contents of which are incorporated herein by reference in its entirety.

TECHNICAL FIELD

The present disclosure relates to the technical field of semiconductor packaging, in particular to a fan-out antenna packaging structure and preparation method thereof.

BACKGROUND

Circuits of lower-cost, more reliable, faster and higher-density are the goals pursued by integrated circuit packaging. In the future, integrated circuit packaging will increase the integration density of various electronic components by continuously reducing the minimum feature sizes. At present, advanced packaging methods include Wafer Level Chip Scale Packaging (WLCSP), Fan-Out Wafer Level Packaging (FOWLP), Flip Chip (Flip Chip), Package on Package (POP), and so on.

Fan-out wafer level packaging is an embedded chip packaging method based on wafer level processing, and it is one of the advanced packaging methods with more input/output (I/O) ports and better integration flexibility. Fan-out wafer level packaging has the following unique advantages over conventional wafer level packaging: 1) I/O spacing is flexible and it is independent of chip size; 2) only effective dies are used and the product yield can be improved; 3) the 3D packaging path is flexible and patterns in any array can be formed at the top; 4) the electrical and thermal performance is better; 5) it can be applied in high frequency; and 6) it is easy to achieve high-density wiring in a redistribution layer (RDL).

At present, a fan-out wafer level packaging method of radio frequency chips generally comprises the following steps: providing a carrier and forming an adhesive layer on a surface of the carrier; obtaining a redistribution layer (RDL) on the adhesive layer by performing photo-etching and electroplating; mounting the radio frequency chip on the redistribution layer by adopting a chip bonding process; packaging the chip in a plastic packaging material layer by adopting an injection molding process; removing the carrier and the adhesive layer; forming an Under-Bump Metal (UBM) layer on the redistribution layer by performing photo-etching and electroplating; performing ball placement and reflow on the UBM layer to form a solder ball bump; and then performing wafer bonding and dicing. For the sake of communication effect, antennas will be provided when the radio frequency chip is used, and for the existing radio frequency chip, either antennas are directly laid out on a PCB or interfaces for connecting external antennas are provided by developers when layout design is performed for radio frequency function modules. However, due to the inconvenience in connecting the external antennas, most of the existing antennas are laid out directly on the PCB, in order to ensure the antenna gain, the size of the antennas must be large enough, and this will inevitably be at the expense of the PCB area.

In view of this, it is necessary to design a new fan-out antenna packaging structure and a fabrication method thereof to solve the above problems that, in order to ensure the antenna gain when the existing radio frequency chip is used, the size and area of the antennas must be large enough, and this will result in the area of the PCB and the entire packaging structure becoming larger.

SUMMARY

The present disclosure provides a fan-out antenna packaging structure, comprising: a semiconductor chip; a plastic packaging material layer comprising a first surface and a second surface opposite to the first surface, wherein the plastic packaging material layer encloses a periphery of the semiconductor chip and exposes a front surface of the semiconductor chip; a metal connecting pole located in the plastic packaging material layer and running through the plastic packaging material layer from top to bottom; an antenna structure located on the first surface of the plastic packaging material layer and electrically connected with the metal connecting pole; a redistribution layer located on the second surface of the plastic packaging material layer and electrically connected with the semiconductor chip and the metal connecting pole; and a solder bump located on a surface, insulated from the plastic packaging material layer, of the redistribution layer, and electrically connected with the redistribution layer.

Preferably, the semiconductor chip comprises a substrate; and a contact pad located on a front surface of the substrate and electrically connected with the substrate.

Preferably, the antenna structure comprises a dielectric layer and a metal antennas layer, which are alternately stacked and having the metal antennas on top, wherein the metal antennas and the metal connecting pole are electrically connected through a metal plug.

Preferably, the antenna structure comprises a layer of metal antennas.

Preferably, the metal antennas have a shape of spiral rectangular.

Preferably, a number of the metal antennas is more than one, the more than one metal antennas are distributed in a plane of the dielectric layer.

Preferably, the redistribution layer comprises: an insulating layer located on the second surface of the plastic packaging material layer; one metal wire layer located in the insulating layer and electrically connected with the semiconductor chip and the metal connecting pole; and an under-bump metal layer located in the insulating layer and electrically connected with the metal wire layer and the solder bump, wherein the under-bump metal layer is insulated from the plastic packaging material layer.

The present disclosure further provides a method for fabricating a fan-out antenna packaging structure comprising the following steps:

1) providing a carrier and forming a peeling layer on an upper surface of the carrier;

2) mounting a semiconductor chip facing down on an upper surface of the peeling layer;

3) forming a metal connecting pole on the upper surface of the peeling layer;

4) forming a plastic packaging material layer on the upper surface of the peeling layer, wherein the plastic packaging material layer fills a gap between the semiconductor chip and the metal connecting pole, and encloses the semiconductor chip and the metal connecting pole; wherein the plastic packaging material layer comprises a first surface and a second surface opposite to the first surface, the second surface of the plastic packaging material layer is in contact with the peeling layer, and the first surface of the plastic packaging material layer exposes an upper surface of the metal connecting pole;

5) removing the carrier and the peeling layer;

6) forming a redistribution layer on the second surface of the plastic packaging material layer, wherein the redistribution layer is electrically connected with the semiconductor chip and the metal connecting pole;

7) forming an antenna structure on the first surface of the plastic packaging material layer, wherein the antenna structure is electrically connected with the metal connecting pole; and 8) forming a solder ball bump on a surface of the redistribution layer, wherein the solder ball bump is electrically connected with the redistribution layer and insulated from the plastic packaging material layer.

Preferably, step 7) of forming the antenna structure on the first surface of the plastic packaging material layer further comprises the following steps:

7-1) forming a first dielectric layer on the first surface of the plastic packaging material layer;

7-2) forming a first opening in the first dielectric layer, wherein the first opening exposes the upper surface of the metal connecting pole;

7-3) forming a first metal plug in the first opening and forming a first layer of metal antennas on an upper surface of the first dielectric layer, wherein the first layer of metal antennas is electrically connected with the metal connecting pole through the first metal plug;

7-4) forming a second dielectric layer on the upper surface of the first dielectric layer on which the first layer of metal antennas is formed, wherein the second dielectric layer covers the first layer of metal antennas;

7-5) forming a second opening in the second dielectric layer, wherein the second opening exposes part of the first layer of metal antennas; and 7-6) forming a second metal plug in the second opening, and forming a second layer of metal antennas on the second dielectric layer.

Preferably, in step 7), the method for forming an antenna structure on the first surface of the plastic packaging material layer further comprises: forming a metal antennas on the first surface of the plastic packaging material layer as the antenna structure.

Preferably, the metal antennas have a shape of spiral rectangular.

Preferably, a number of the metal antennas is more than one, and distributed in a plane of the surface of the dielectric layer.

BRIEF DESCRIPTION OF THE DRAWINGS

FIG. 12 is atop view and all other of FIGURES are cross sectional views of the structure.

DESCRIPTION OF COMPONENT REFERENCE SIGNS

Figure 1:
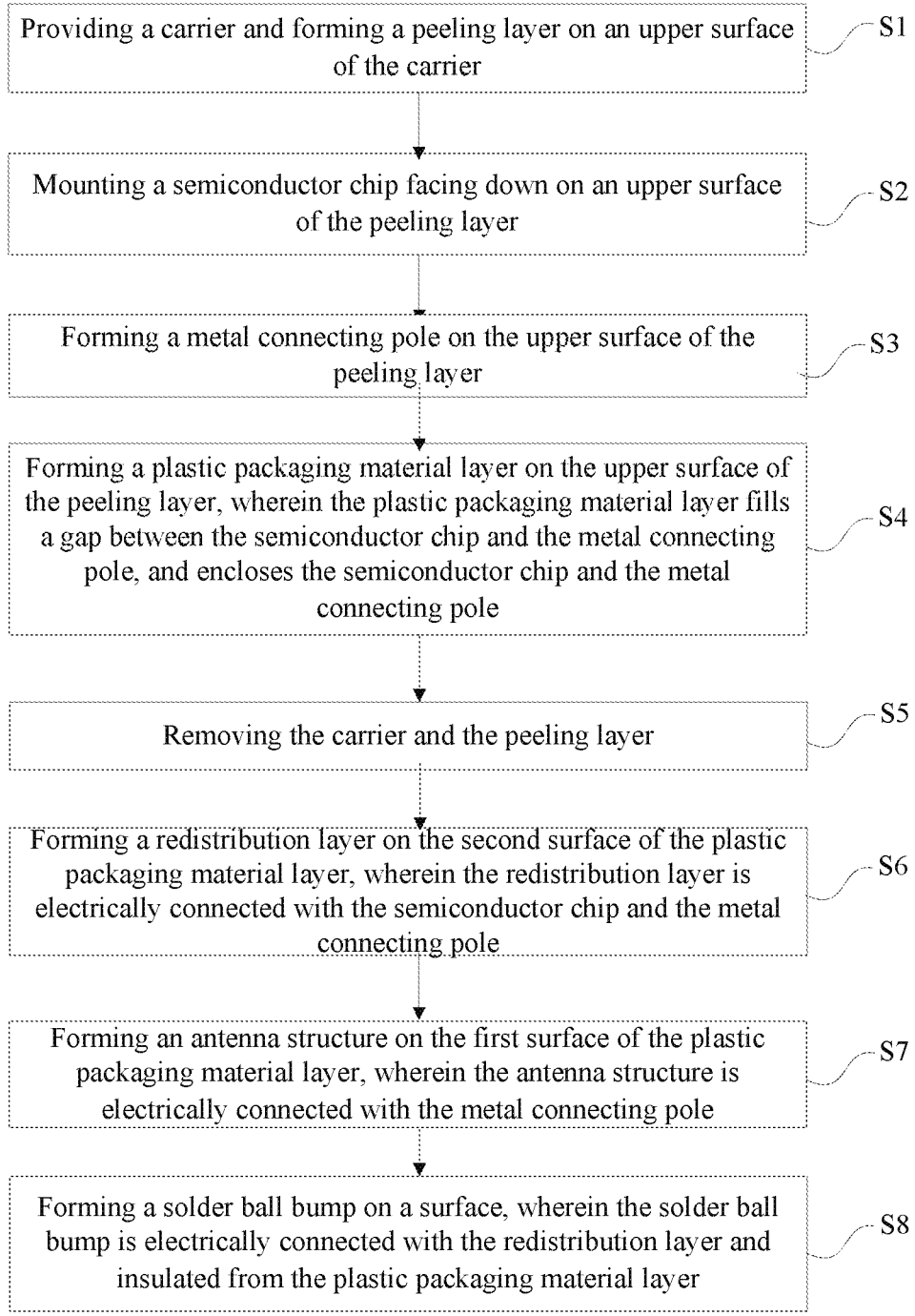
FIG. 1 illustrates a flowchart for a method for preparing a fan-out antenna packaging structure provided in embodiment 1 of the present disclosure.

10 Carrier
11 Peeling layer
12 Semiconductor chip
121 Substrate
122 Contact pad
13 Metal connecting pole
14 Plastic packaging material layer
15 Redistribution layer
151 Insulating layer
152 Metal wire layer
153 Under-bump metal layer
16 Antenna structure
161 Dielectric layer
1611 First dielectric layer
1612 Second dielectric layer
162 Metal antenna
163 Metal plug
1631 First metal plug
1632 Second metal plug
17 Solder ball bump
Step 1)-8) Steps

DETAILED DESCRIPTION OF THE PREFERRED EMBODIMENTS

The implementation modes of the present disclosure will be described below through specific examples. One skilled in the art can easily understand other advantages and effects of the present disclosure according to content disclosed in the description.

Please refer to FIG. 1 to FIG. 14. It needs to be stated that the drawings provided in this embodiment are just used for schematically describing the basic concept of the present disclosure, thus only illustrate components only related to the present disclosure and are not drawn according to the numbers, shapes and sizes of components during actual implementation, the configuration, number and scale of each component during actual implementation thereof may be freely changed, and the component layout configuration thereof may be more complicated.

Embodiment 1

Referring to FIG. 1, the present disclosure provides a method for preparing a fan-out antenna packaging structure, comprises the following steps:

1) providing a carrier and forming a peeling layer on an upper surface of the carrier;

2) providing a semiconductor chip and mounting the semiconductor chip on a surface of the peeling layer with a front surface of the semiconductor chip facing downwards;

3) forming a metal connecting pole on the surface of the peeling layer;

4) forming a plastic packaging material layer on the surface of the peeling layer, wherein the plastic packaging material layer fills a gap between the semiconductor chip and the metal connecting pole, and packages the semiconductor chip and the metal connecting pole; the plastic packaging material layer comprise a first surface and a second surface opposite to the first surface, the second surface of the plastic packaging material layer is in contact with the peeling layer, and the first surface of the plastic packaging material layer exposes an upper surface of the metal connecting pole;

5) removing the carrier and the peeling layer;

6) forming a redistribution layer on the second surface of the plastic packaging material layer, wherein the redistribution layer is electrically connected with the semiconductor chip and the metal connecting pole;

7) forming an antenna structure on the first surface of the plastic packaging material layer, wherein the antenna structure is electrically connected with the metal connecting pole; and 8) forming a solder ball bump on a surface, insulated from the plastic packaging material layer, of the redistribution layer, wherein the solder ball bump is electrically connected with the redistribution layer.

Figure 2:
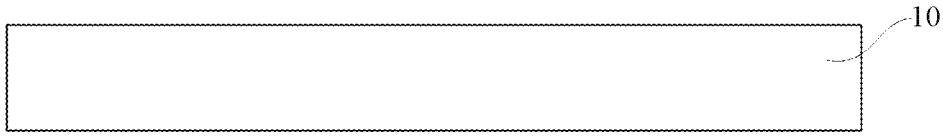
FIG. 2 to FIG. 12 illustrate schematic structural views in each of the steps of the method for preparing a fan-out antenna packaging structure provided in embodiment 1 of the present disclosure.
Figure 3:
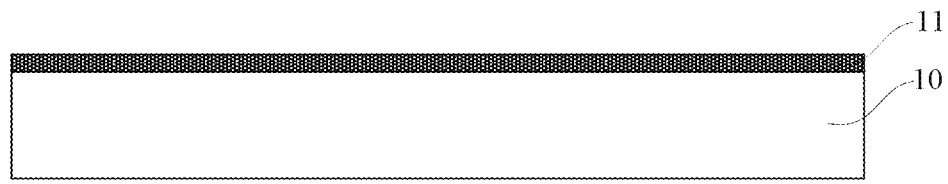

In step 1), referring to step S1 in FIG. 1 and FIG. 2 to FIG. 3, a carrier is provided and a peeling layer is formed on an upper surface of the carrier.

As an example, as illustrated in FIG. 2, a material of the carrier 10 includes but is not limited to one of silicon, glass, silicon oxide, ceramics, polymer and metal, or a combination thereof, and the shape of the carrier 10 may be a wafer shape, square shape or any other required shape. In this embodiment, the carrier 10 is used for structuring support during process, in order to prevent the semiconductor chip from being broken, warped and cracked during subsequent preparation.

As an example, as illustrated in FIG. 3, the peeling layer 11 acts as a separation layer between a subsequently formed redistribution layer 12 and other structures on the redistribution layer 122, and the carrier 10 in a subsequent process. The peeling layer 11 is preferably made of an adhesive material with a smooth surface, and must have a certain binding force with the redistribution layer 12 to guarantee that the redistribution layer 122 will not move in the subsequent process. In addition, the peeling layer 11 also has a strong binding force with the carrier 10. Generally speaking, the binding force with the carrier 10 needs to be greater than that with the redistribution layer 122. As an example, the material of the peeling layer 11 may be an adhesive tape with both sides having viscosity or adhesive made through a spin-coating process, etc. The adhesive tape is preferably a UV tape, which is easily torn off after exposure to UV light. In other implementation modes, the peeling layer 11 may be other material layers formed through physical vapor deposition or chemical vapor deposition, such as epoxy, silicone rubber, polyimide (PI), polybenzoxazole (PBO) and benzocyclobutene (BCB). When the carrier 10 is subsequently separated, the peeling layer 11 can be removed by means of wet etching, chemical mechanical polishing, tearing, etc.

Figure 4:
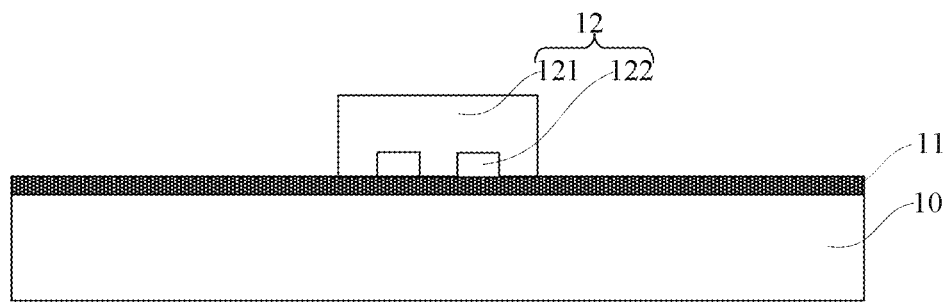

In step 2), please referring to step S2 in FIG. 1 and FIG. 4, a semiconductor chip 12 is provided and the semiconductor chip 12 is mounted on a surface of the peeling layer 11 with a front surface of the semiconductor chip 12 facing downwards.

As an example, the semiconductor chip 12 may be any chip, such as a radio frequency chip. The semiconductor chip 12 comprises a substrate 121 and a contact pad 122, wherein the contact pad 122 is located on the substrate 121 and is electrically connected with the substrate 121; and wherein a surface on which the contact pad 122 is located is the front surface of the semiconductor chip 12.

It needs to be noted that the semiconductor chip 12 may be any one of existing radio frequency communication chips for transmitting and receiving communication information. The thickness of the semiconductor chip 12 may be set according to actual needs. Preferably, in this embodiment, the thickness of the semiconductor chip 12 may be, but not limited to, 100 μm-200 μm.

As an example, the number of the semiconductor chips 12 may be set according to actual needs, and the number of the semiconductor chips 12 mounted on the peeling layer 11 may be one, two or more.

Figure 5:
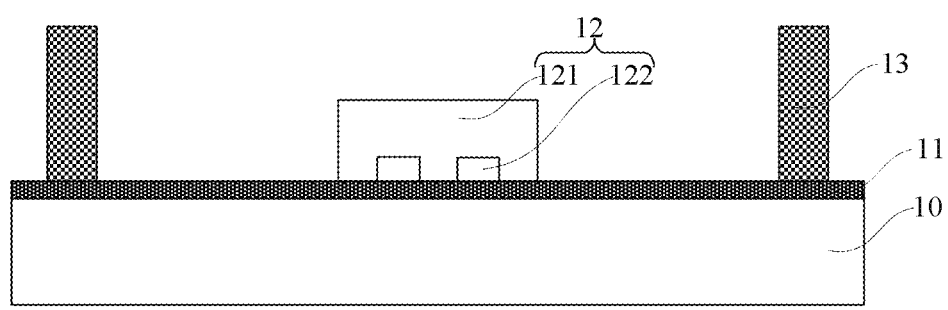

In step 3), please referring to step S3 in FIG. 1 and FIG. 5, a metal connecting pole 13 is formed on the surface of the peeling layer 11.

As an example, the metal connecting pole 13 may be formed on the upper surface of the peeling layer 11 by adopting processes such as electroplating, metal printing and welding.

As an example, the material of the metal connecting pole 13 may include one or more of Cu, Al, Ag, Au, Sn, Ni, Ti and Ta, or other suitable conductive metal materials. Preferably, in this embodiment, the material of the metal connecting pole 13 is Cu.

As an example, the height of the metal connecting pole 13 may be set according to actual needs. Preferably, in this embodiment, the height of the metal connecting pole 13 is greater than the thickness of the semiconductor chip 12, that is, the upper surface of the metal connecting pole 13 is higher than the back surface of the semiconductor chip 12.

Figure 6:
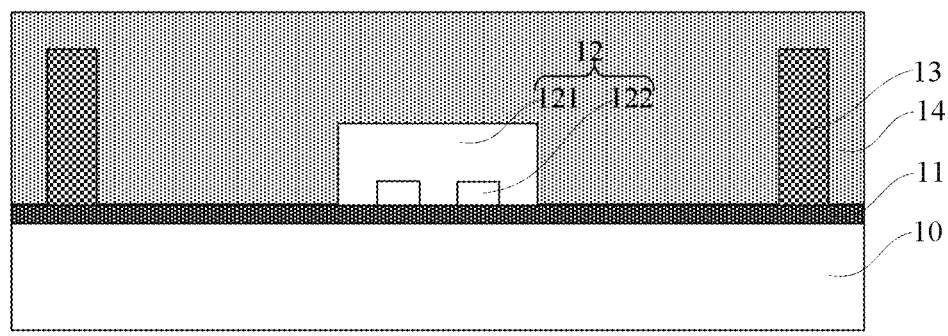
Figure 7:
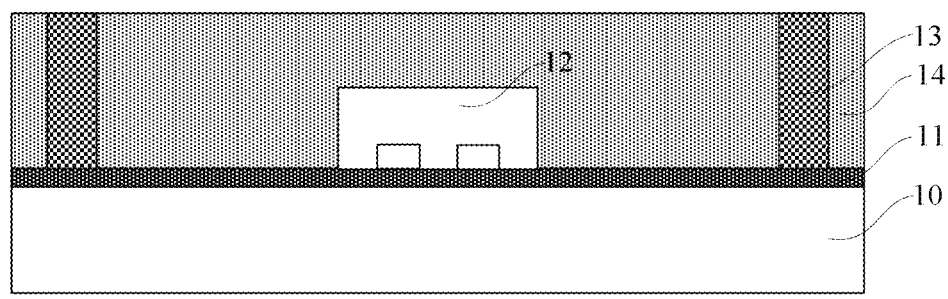

In step 4), please referring to step S4 in FIG. 1 and FIG. 6 to FIG. 7, a plastic packaging material layer 14 is formed on the surface of the peeling layer 11. The plastic packaging material layer fills a gap between the semiconductor chip 12 and the metal connecting pole 13, and packages the semiconductor chip 12 and the metal connecting pole 13; The plastic packaging material layer 14 comprises a first surface and a second surface opposite to the first layer, the second surface of the plastic packaging material layer 14 is in contact with the peeling layer 11, and the first surface of the plastic packaging material layer 14 exposes an upper surface of the metal connecting pole 13.

As an example, the plastic packaging material layer 14 may be formed on the upper surface of the peeling layer 11 by adopting a compression molding, transfer molding, liquid seal molding, molding underfill, capillary underfill, vacuum laminating or spin coating process. Preferably, in this embodiment, the plastic packaging material layer 14 is formed on the upper surface of the peeling layer 11 by adopting the molding underfill process.

As an example, the material of the plastic packaging material layer 14 may be, but is not limited to, a polyimide layer, a silica gel layer, an epoxy resin layer, a curable polymer-based material layer, or a curable resin-based material layer.

In one example, firstly the plastic packaging material layer 14 is formed on the upper surface of the peeling layer 11, and the plastic packaging material layer 14 completely packages the semiconductor chip 12 and the metal connecting pole 13. That is, the first surface of the plastic packaging material layer 14 is higher than the upper surface of the metal connecting pole 13, as illustrated in FIG. 6. Then part of the plastic packaging material layer 14 is removed by adopting processes such as chemical mechanical polishing (CMP), such that the first surface of the plastic packaging material layer 14 is leveled with the upper surface of the metal connecting pole 13, as illustrated in FIG. 7.

In another example, the plastic packaging material layer 14 may be formed according to the height of the metal connecting pole 13 such that the height of the formed plastic packaging material layer 14 is the same as the height of the metal connecting pole 13, i.e., the first surface of the plastic packaging material layer 14 is leveled with the upper surface of the metal connecting pole 13. In this way, the step of grinding the plastic packaging material layer 14 can be omitted, thereby simplifying the process steps.

Figure 8:
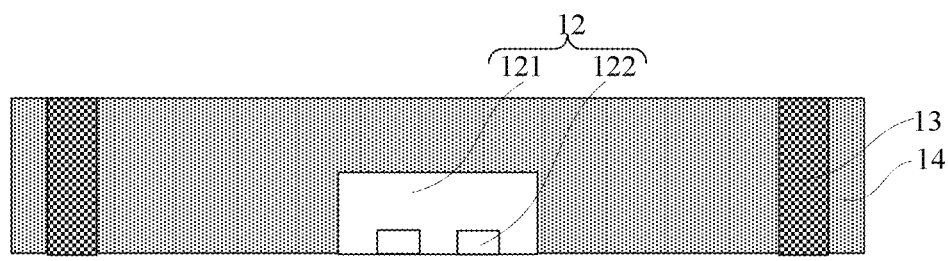

In step 5), please referring to step S5 in FIG. 1 and FIG. 8, the carrier 10 and the peeling layer 11 are removed.

As an example, the carrier 10 and the peeling layer 11 maybe removed by adopting a grinding process, a thinning process, etc. Preferably, in this embodiment, the carrier 10 is removed by tearing off the peeling layer 11.

Figure 9:
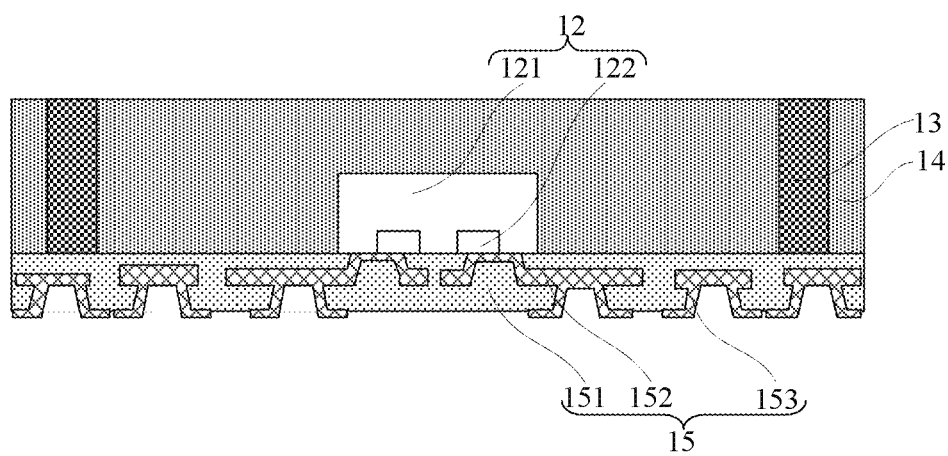

In step 6), please referring to step S6 in FIG. 1 and FIG. 9, a redistribution layer 15 is formed on the second surface of the plastic packaging material layer 14, and the redistribution layer 15 is electrically connected with the semiconductor chip 12 and the metal connecting pole 13.

In one example, the redistribution layer 15 comprises an insulating layer and a metal wire layer, and forming the redistribution layer 15 on the second surface of the plastic packaging material layer 14 comprises the following steps:

6-1) forming the metal wire layer on the second surface of the plastic packaging material layer 14; and 6-2) forming an insulating layer on the upper surface of the plastic packaging material layer 14, wherein the insulating layer wraps the metal wire layer.

In another example, the redistribution layer 15 comprises an insulating layer and a metal wire layer, and forming the redistribution layer 15 on the second surface of the plastic packaging material layer 14 comprises the following steps:

6-1) forming the insulating layer on the second surface of the plastic packaging material layer 14, and forming a via hole in the insulating layer through photo-etching and etching processes, wherein the via defines the shape of the metal wire layer; and

6-2) forming the metal wire layer in the via.

In another example, as illustrated in FIG. 9, the redistribution layer 15 comprises a metal wire layer 152, at least one insulating layer 151, and an under-bump metal layer 153, and forming the redistribution layer 15 on the second surface of the plastic packaging material layer 14 comprises the following steps:

6-1) forming the metal wire layer 152 on the second surface of the plastic packaging material layer 14, wherein the metal wire layer 152 is electrically connected with the semiconductor chip 12;

6-2) forming the insulating layer 151 on the second surface of the plastic packaging material layer 14, wherein the insulating layer 151 wraps the metal wire layer 152 and the upper surface of the insulating layer 151 is higher than the upper surface of the metal wire layer 152;

6-3) forming an opening in the insulating layer 151, wherein the opening exposes part of the metal wire layer 152; and

6-4) forming the under-bump metal layer 153 in the opening.

In another example, as illustrated in FIG. 9, the redistribution layer 15 comprises a metal wire layer 152, at least one insulating layer 151, and an under-bump metal layer 153, and forming the redistribution layer 15 on the second surface of the plastic packaging material layer 14 comprises the following steps:

6-1) forming a first insulating layer 151 on the second surface of the plastic packaging material layer 14;

6-2) forming a first opening in the first insulating layer 151, wherein the first opening exposes the connecting pad 122 of the semiconductor chip 12;

6-3) forming the metal wire layer 152 in the first opening;

6-4) forming a second insulating layer 151 on the upper surface of the first insulating layer 151;

6-5) forming a second opening in the second insulating layer 151, wherein the second opening exposes the metal wire layer 152; and

6-6) forming the under-bump metal layer 153 in the second opening.

As an example, in the above-mentioned example, the material of the metal wire layer 152 may be, but is not limited to, one of copper, aluminum, nickel, gold, silver and titanium, or a combination thereof, the metal wire layer 152 may be formed by adopting a process such as PVD, CVD, sputtering, electroplating or electroless plating. The material of the insulating layer 121 may be a low k dielectric material. Specifically, the material of the insulating layer 151 may include one of epoxy resin, silica gel, PI, PBO, BCB, silica, phosphorus silica glass and fluorine glass, and the insulating layer 151 may be formed by adopting processes such as spin coating, CVD and plasma enhanced chemical vapor deposition (PECVD).

In step 7), please referring to step S7 in FIG. 1 and FIG. 10 to FIG. 12, an antenna structure 16 is formed on the first surface of the plastic packaging material layer 14, and the antenna structure 16 is electrically connected with the metal connecting pole 13.

Figure 10:
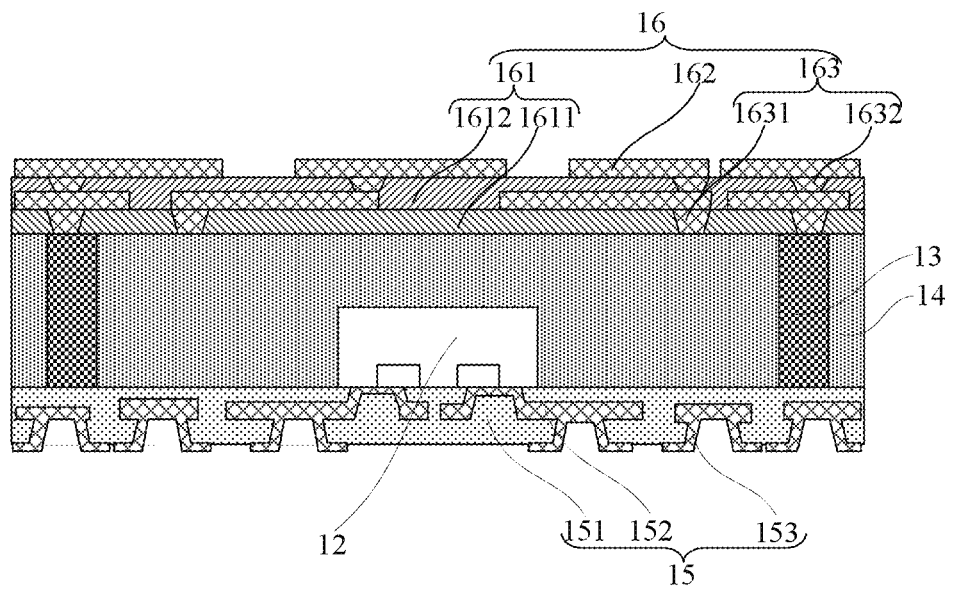

In one example, as illustrated in FIG. 10, forming an antenna structure 16 on the first surface of the plastic packaging material layer 14 comprises the following steps:

7-1) forming a first dielectric layer 1611 on the first surface of the plastic packaging material layer 14;

7-2) forming a first opening (not shown) in the first dielectric layer 1611, wherein the first opening exposes the upper surface of the conductive pole 15;

7-3) forming a first metal plug 1631 in the first opening and forming a first layer of metal antennas 162 on an upper surface of the first dielectric layer 1611, wherein the first layer of metal antennas 162 is electrically connected with the conductive pole 15 through the first metal plug 1611;

7-4) forming a second dielectric layer 1612 on the upper surface of the first dielectric layer 1611 on which the first layer of metal antennas 162 are formed, wherein the second dielectric layer 1612 completely covers the first layer of metal antennas 162; the first dielectric layer 1611 and the second dielectric layer 1612 jointly form the dielectric layer 161;

7-5) forming a second opening (not shown) in the second dielectric layer 1612, wherein the second opening exposes part of the first layer of metal antennas 162; and

7-6) forming a second metal plug 1632 in the second opening and forming a second layer of metal antennas 162 on the second dielectric layer 1612; wherein the first metal plug 1631 and the second metal plug 1632 jointly form the metal plug 163.

Figure 11:
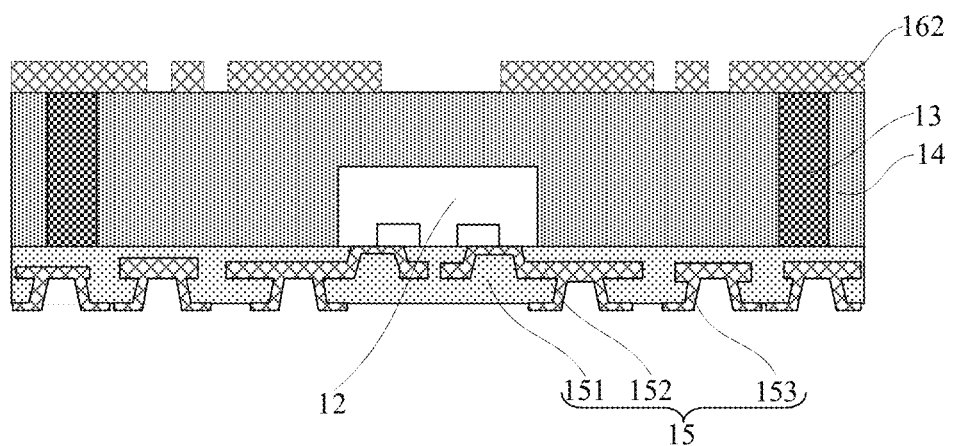

In another example, as illustrated in FIG. 11, a layer of metal antennas 162 may also be formed on the first surface of the plastic packaging material layer 15 as the antenna structure 16.

As an example, the shape of the metal antenna 162 may be set according to actual needs. Preferably, in this embodiment, the metal antennas 162 may be, but not limited to, spiral rectangular, as illustrated in FIG. 11. Of course, in other examples, the metal antennas 162 may also be in any other shapes, such as spirally circular shape or bow shape.

As an example, the material of the dielectric layer 161 may include, but not limited to, silicon dioxide or polyethylene terephthalate (PET). The dielectric layer 16 may be prepared by adopting processes such as spin coating, chemical vapor deposition (CVD) and plasma enhanced chemical vapor deposition (PECVD. The material of the metal antennas 162 and the metal plug 163 may include, but not limited to, one or more of copper, aluminum, nickel, gold, silver, tin, and titanium, wherein the metal antennas 162 and the metal plug 163 may be prepared by adopting one of physical vapor deposition (PVD), chemical vapor deposition (CVD), sputtering, electroplating, and electroless plating.

As an example, the thickness of the first dielectric layer 1611 may be, but not limited to, 10 µm-15 µm, the thickness of the second dielectric layer 1612 may be, but not limited to, 10 µm-15 µm, and the thickness of the metal antennas 162 may be 5 µm-10 µm.

Figure 12:
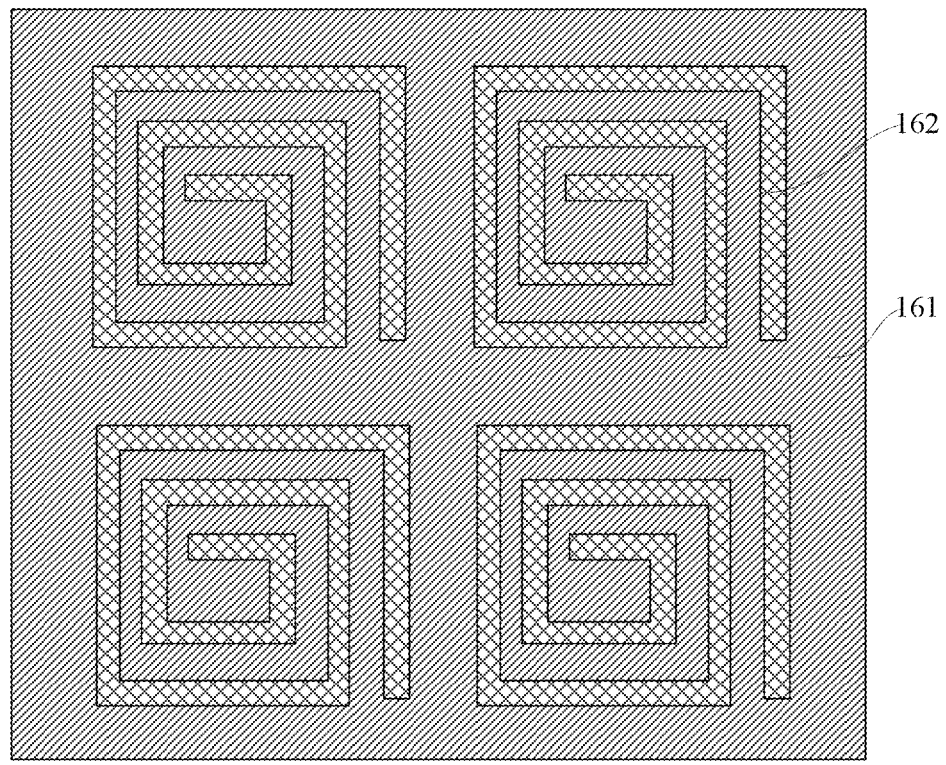

As an example, the number of the metal antennas 162 on each layer maybe set according to actual needs. Preferably, in this embodiment, the number of the metal antennas 162 on each layer is more than one, and the more than one metal antennas 162 are distributed in an array along an extending direction of the surface of the dielectric layer 161. FIG. 12 illustrates an example that the number of the metal antenna 162 is four. Of course, in other examples, the number of the metal antennas 162 on each layer may also be set to one, two, three, five or more, and so on, according to actual needs. It needs to be noted that, in other examples, the number of the metal antennas 162 on the first layer may be the same as or different from that on the second layer. For example, the number of the metal antennas 162 on the first layer and the number of the metal antennas 162 on the second layer may be four, or the number of the metal antennas 162 on the first layer is one, the number of the metal antennas 162 on the second layer is four, and so on.

It needs to be further noted that, when the number of the semiconductor chip 12 is one, one metal antenna 162 corresponding thereto from top to bottom may be provided on each layer of metal antennas 162 above the semiconductor chip 12, and more than one metal antennas 162 may also be provided on each layer of metal antennas 162 above the semiconductor chip 12. When the number of the semiconductor chips 12 is two or more, one metal antenna 162 may be provided on each layer of the metal antennas 162 above the semiconductor chip 12, more than one metal antennas 162 may also be provided on each layer of metal antennas 162 above the semiconductor chip 12, and the metal antennas 162 on each layer of metal antennas 162 are provided corresponding to the semiconductor chips 12 one to one from top to bottom.

Figure 13:
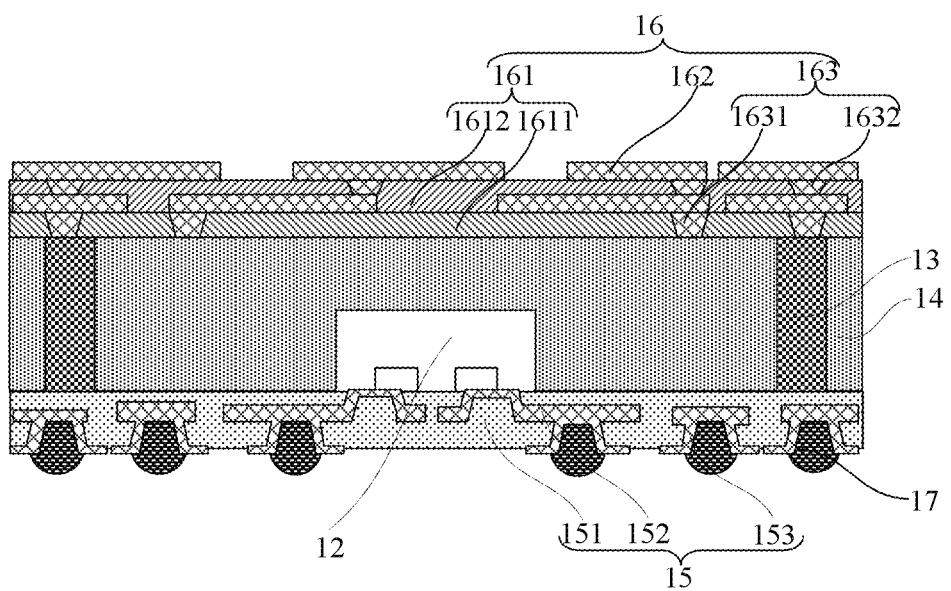
FIG. 13 to FIG. 14 illustrate cross sectional views of steps in a method for preparing a fan-out antenna packaging structure provided in embodiment 2 of the present disclosure.
Figure 14:
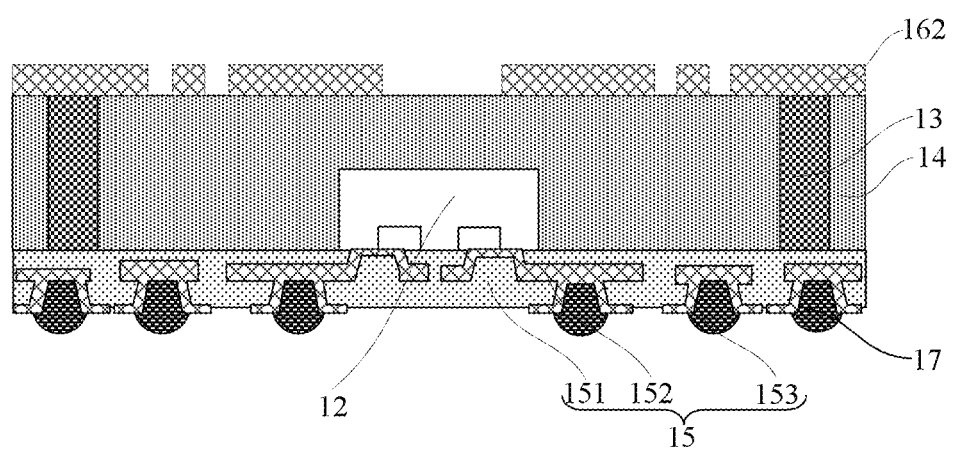

In step 8), please referring to step S8 in FIG. 1 and FIG. 13 to FIG. 14, a solder ball bump 17 is formed on a surface, away from the plastic packaging material layer 14, of the redistribution layer 15, and the solder ball bump 17 is electrically connected with the redistribution layer 15.

In one example, forming a solder ball bump 17 on a surface, insulated from the plastic packaging material layer 14, of the redistribution layer 15 comprises the following steps:

8-1) forming a metal pole (not shown) on the surface, insulated from the plastic packaging material layer 14, of the redistribution layer 15, wherein the metal poleis electrically connected with the metal wire layer 152 in the redistribution layer 15; and 8-2) forming a solder ball on the surface, insulated from the rewiring layer 15, of the metal pole.

As an example, the material of the metal pole may be one of copper, aluminum, nickel, gold, silver and titanium, or a combination in an alloy thereof, the metal pole may be formed by adopting any one of processes such as physical vapor deposition (PVD), chemical vapor deposition (CVD), sputtering, electroplating and electroless plating. The material of the sold ball may be one of copper, aluminum, nickel, gold, silver and titanium, or a combination thereof, and the sold ball may be formed by adopting a ball placement and reflow process.

In another example, as illustrated in FIGS. 13 and 14, the solder ball bump 17 is a solder ball, which can be directly formed as the solder ball bump 17 by adopting a ball placement and reflow process. The solder ball bump 17 is directly connected with the metal wire layer 152 in the redistribution layer 15. As an example, the height of the solder ball bump 17 may be, but not limited to, 190 µm.

Embodiment 2

Please refer to FIG. 13 and FIG. 14. This embodiment provides a fan-out antenna packaging structure. The fan-out antenna packaging structure comprises: a semiconductor chip 12; a plastic packaging material layer 14 comprising a first surface and a second surface opposite to the first surface, wherein the plastic packaging material layer 14 packages a periphery of the semiconductor chip 12 and exposes a front surface of the semiconductor chip 12; a metal connecting pole 13 located in the plastic packaging material layer 14 and running through the plastic packaging material layer 14 from top to bottom; an antenna structure 16 located on the first surface of the plastic packaging material layer 14 and electrically connected with the metal connecting pole 13; a redistribution layer 15 located on the second surface of the plastic packaging material layer 14 and electrically connected with the semiconductor chip 12 and the metal connecting pole 13; and a solder bump 17 located on a surface, insulated from the plastic packaging material layer 14, of the redistribution layer 15, and electrically connected with the redistribution layer 15.

As an example, the semiconductor chip 12 may be a radio frequency chip, for example. The semiconductor chip 12 comprises a substrate 121 and a contact pad 122, wherein the contact pad 122 is located on the substrate 121 and is electrically connected with the substrate 121, wherein a surface on which the contact pad 122 is located is the front surface of the semiconductor chip 12.

It needs to be noted that the semiconductor chip 12 may be any one of existing radio frequency communication chips for transmitting and receiving communication information. The thickness of the semiconductor chip 12 may be set according to actual needs. Preferably, in this embodiment, the thickness of the semiconductor chip 12 may be, but not limited to, 100 µm-200 µm.

As an example, the number of the semiconductor chips 12 may be set according to actual needs, and the number of the semiconductor chips 12 mounted on the peeling layer 11 may be one, two or more.

As an example, the material of the plastic packaging material layer 14 may be, but is not limited to, a polyimide layer, a silica gel layer, an epoxy resin layer, a curable polymer-based material layer, or a curable resin-based material layer.

As an example, the metal connecting pole 13 may be formed on the upper surface of the peeling layer 11 by adopting electroplating, metal printing, welding, etc.

As an example, the material of the metal connecting pole 13 may include one or more of Cu, Al, Ag, Au, Sn, Ni, Ti, and Ta, or other suitable conductive metal materials. Preferably, in this embodiment, the material of the metal connecting pole 13 is Cu.

As an example, the height of the metal connecting pole 13 may be set according to actual needs. Preferably, in this embodiment, the height of the metal connecting pole 13 is greater than the thickness of the semiconductor chip 12, that is, the upper surface of the metal connecting pole 13 is higher than the back surface of the semiconductor chip 12.

In one example, as illustrated in FIG. 13, the antenna structure 16 comprises a dielectric layer 161 and metal antennas 162 which are alternately stacked, and a top layer of the antenna structure 16 is metal antennas 162. The metal antennas 162 and the metal connecting pole 13 are electrically connected through a metal plug 163. Herein, FIG. 13 illustrates an example that the dielectric layer 161 comprises two layers (i.e., comprising a first dielectric layer 1611 and a second dielectric layer 1622), and the metal antennas 162 also comprise two layers.

In another example, as illustrated in FIG. 14, the antenna structure 16 may also comprise only one layer of metal antennas 162.

As an example, the shape of the metal antenna 162 maybe set according to actual needs. Preferably, in this embodiment, the metal antennas 162 may be, but not limited to, spiral rectangular. Of course, in other examples, the metal antennas 162 may also be in any other shapes, such as spirally circular shape or bow shape.

As an example, the material of the dielectric layer 161 may include, but not limited to, silicon dioxide or PET (polyethylene terephthalate). The material of the dielectric layer 161 is prepared by adopting processes such as spin coating, chemical vapor deposition (CVD) and plasma enhanced chemical vapor deposition (PECVD). The material of the metal antennas 162 and the metal plug 163 may include, but not limited to, one or more of copper, aluminum, nickel, gold, silver, tin, and titanium, wherein the metal antennas 162 and the metal plug 163 may be prepared by adopting one of physical vapor deposition (PVD), chemical vapor deposition (CVD), sputtering, electroplating, and electroless plating.

As an example, the thickness of the first dielectric layer 1611 may be, but not limited to, in a range of 10 µm-15 µm, the thickness of the second dielectric layer 1612 may be, but not limited to, in a range of 10 µm-15 µm, and the thickness of the metal antennas 162 may be in a range of 5 µm-10 µm.

As an example, the number of the metal antennas 162 on each layer may be set according to actual needs. Preferably, in this embodiment, the number of the metal antennas 162 on each layer is more than one, and the more than one metal antennas 162 are distributed in an array along an extending direction of the surface of the dielectric layer 161, wherein FIG. 12 illustrates an example that the number of the metal antenna 162 is four. Of course, in other examples, the number of the metal antennas 162 on each layer may also be set to one, two, three, five or more, and so on, according to actual needs. It needs to be noted that, in other examples, the number of the metal antennas 162 on the first layer may be the same as or different from that on the second layer. For example, the number of the metal antennas 162 on the first layer and the number of the metal antennas 162 on the second layer may be four; or the number of the metal antennas 162 on the first layer is one, the number of the metal antennas 162 on the second layer is four, and so on.

It needs to be further noted that, when the number of the semiconductor chip 12 is one, one metal antenna 162 corresponding thereto from top to bottom may be provided in each layer of metal antennas 162 above the semiconductor chip 12, or more than one metal antennas 162 may be provided in each layer of metal antennas 162 above the semiconductor chip 12. When the number of the semiconductor chips 12 is two or more, one metal antenna 162 may be provided in each layer of the metal antennas 162 above the semiconductor chip 12, or more than one metal antennas 162 may be provided in each layer of metal antennas 162 above the semiconductor chip 12, and the metal antennas 162 in each layer of metal antennas 162 are provided in one-to-one correspondence to the semiconductor chips 12 from top to bottom.

According to the present disclosure, by forming the antenna structure 16 on the first surface of the plastic packaging material layer 14, the antenna structure 16 is located above the semiconductor chip 12, such that the space area can be greatly reduced and the size of the packaging structure can be smaller. The metal antennas 162 in the antenna structure 16 adopt a stack and spiral structure, such that antennas with large area and length can be formed in a small area, the antenna gain is greatly improved, which not only can guarantee the stability of the radio frequency chip, but also can improve the communication distance. The metal antennas 162 in the antenna structure 16 may be prepared by adopting a dry etching process, the antenna width thereof can be very small, and the density of the metal antennas 162 in the antenna structure 16 can be greatly increased. Therefore, the packaging structure provided by the present disclosure has better integration.

As an example, the redistribution layer 15 comprises: an insulating layer 151 located on the second surface of the plastic packaging material layer 14; at least one metal wire layer 152 located in the insulating layer 151 and electrically connected with the semiconductor chip 12 and the metal connecting pole 13; and an under-bump metal layer 153 located in the insulating layer 151 and a surface, insulated from the plastic packaging material layer 14, of the insulating layer 151, and electrically connected with the metal wire layer 152 and the solder bump 17. As an example, the height of the solder ball bump 17 may be, but not limited to, about 190 µm.

To sum up, the present disclosure provides a fan-out antenna packaging structure and a method for preparing the same. The fan-out antenna packaging structure comprises: a semiconductor chip; a plastic packaging material layer comprising a first surface and a second surface opposite to the first surface, the plastic packaging material layer packaging a periphery of the semiconductor chip and exposing a front surface of the semiconductor chip; a metal connecting pole located in the plastic packaging material layer and running through the plastic packaging material layer from top to bottom; an antenna structure located on the first surface of the plastic packaging material layer and electrically connected with the metal connecting pole; a redistribution layer located on the second surface of the plastic packaging material layer and electrically connected with the semiconductor chip and the metal connecting pole; and a solder bump located on a surface, insulated from the plastic packaging material layer, of the redistribution layer, and electrically connected with the redistribution layer. In the present disclosure, by forming the antenna structure on the first surface of the plastic packaging material layer, the antenna structure is located above the semiconductor chip, thus the space area can be greatly reduced and the size of the packaging structure can be smaller. The metal antennas in the antenna structure in the present disclosure adopt a stack and spiral structure, antennas with large area and length can be formed in a small area, the antenna gain is greatly improved, which not only can guarantee the stability of the radio frequency chip, but also can improve the communication distance. The antenna width of the metal antennas in the antenna structure can be very small, and the density of the metal antennas in the antenna structure can be greatly increased. Therefore, the packaging structure provided by the present disclosure has better integration. By forming the antennas in the packaging structure of the radio frequency chip in the present disclosure, it is unnecessary to lay out the antennas in the subsequent application, the problem that the area of the PCB is increased in order to ensure the antenna gain when the existing radio frequency chip is used is solved, which not only can guarantee the antenna gain of the radio frequency chip to be large enough, but also can guarantee the area of the PCB board to be small enough.

The above-mentioned embodiments are only used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

The invention claimed is:

1. A method for preparing a fan-out antenna packaging structure, comprising the following steps:
   1) providing a carrier and forming a peeling layer on an upper surface of the carrier;
   2) mounting a semiconductor chip facing down on an upper surface of the peeling layer;
   3) forming a metal connecting pole on the upper surface of the peeling layer;
   4) forming a plastic packaging material layer on the upper surface of the peeling layer, wherein the plastic packaging material layer fills a gap between the semiconductor chip and the metal connecting pole, and encloses the semiconductor chip and the metal connecting pole; wherein the plastic packaging material layer comprises a first surface and a second surface opposite to the first surface, the second surface of the plastic packaging material layer is in contact with the peeling layer, and the first surface of the plastic packaging material layer exposes an upper surface of the metal connecting pole;
   5) removing the carrier and the peeling layer;
   6) forming a redistribution layer on the second surface of the plastic packaging material layer, wherein the redistribution layer is electrically connected with the semiconductor chip and the metal connecting pole;
   7) forming an antenna structure on the first surface of the plastic packaging material layer, wherein the antenna structure is electrically connected with the metal connecting pole;
   wherein forming the antenna structure comprises:
   7-1) forming a first dielectric layer on the first surface of the plastic packaging material layer;
   7-2) forming a first opening in the first dielectric layer, wherein the first opening exposes the upper surface of the metal connecting pole;
   7-3) forming a first metal plug in the first opening and forming a first layer of metal antennas on an upper surface of the first dielectric layer, wherein the first layer of metal antennas is electrically connected with the metal connecting pole through the first metal plug;
   7-4) forming a second dielectric layer on the upper surface of the first dielectric layer on which the first layer of metal antennas is formed, wherein the second dielectric layer covers the first layer of metal antennas;
   7-5) forming a second opening in the second dielectric layer, wherein the second opening exposes part of the first layer of metal antennas; and
   7-6) forming a second metal plug in the second opening, and forming a second layer of metal antennas on the second dielectric layer; and
   8) forming a solder ball bump on a surface of the redistribution layer, wherein the solder ball bump is electrically connected with the redistribution layer and insulated from the plastic packaging material layer.

2. The method for preparing the fan-out antenna packaging structure according to claim 1, characterized in that, in step 7), the method for forming an antenna structure on the first surface of the plastic packaging material layer comprises: forming the metal antennas on the first surface of the plastic packaging material layer as the antenna structure.

3. The method for preparing the fan-out antenna packaging structure according to claim 2, characterized in that the metal antennas have a shape of spiral rectangular.

4. The method for preparing the fan-out antenna packaging structure according to claim 1, characterized in that the metal antennas have a shape of a spiral rectangular.

5. The method for preparing the fan-out antenna packaging structure according to claim 4, characterized in that a number of the metal antennas is more than one, and distributed in a plane of the surface of the dielectric layers.

* * * * *